United States Patent [19]

Dietrich et al.

[11] Patent Number: 4,572,842
[45] Date of Patent: Feb. 25, 1986

[54] METHOD AND APPARATUS FOR REACTIVE VAPOR DEPOSITION OF COMPOUNDS OF METAL AND SEMI-CONDUCTORS

[75] Inventors: Anton Dietrich, Rodenbach; Klaus Hartig, Ronneburg; Michael Scherer, Rodenbach, all of Fed. Rep. of Germany

[73] Assignee: Leybold-Heraeus GmbH, Cologne, Fed. Rep. of Germany

[21] Appl. No.: 644,314

[22] Filed: Aug. 24, 1984

[30] Foreign Application Priority Data

Sep. 2, 1983 [DE] Fed. Rep. of Germany ....... 3331707

[51] Int. Cl.$^4$ .......................... B05D 3/06; C23C 14/00
[52] U.S. Cl. ................................. 427/39; 204/192 R; 204/298; 427/38; 118/719; 118/726; 118/50.1; 118/623
[58] Field of Search ............. 204/192 R, 298; 427/38, 427/39

[56] References Cited

U.S. PATENT DOCUMENTS

| | | | |
|---|---|---|---|
| 4,006,340 | 2/1977 | Gorinas | 118/723 X |
| 4,019,902 | 4/1977 | Leder et al. | 427/39 X |
| 4,279,216 | 7/1981 | Buhl et al. | 118/723 |
| 4,336,277 | 6/1982 | Bunshah et al. | 118/723 X |
| 4,422,406 | 12/1983 | Behn et al. | 118/719 |

*Primary Examiner*—Thurman K. Page
*Attorney, Agent, or Firm*—Felfe & Lynch

[57] ABSTRACT

Method for reactive vapor deposition of compounds of metals and semi-conductors on at least one substrate by glow discharge. Into a space between a magnetron cathode (1) with a target (5) and the substrate (11) an inert gas and a reaction gas for the formation of the desired compound with the target material are separately introduced. Two solve the problem of making it possible to maintain the vapor deposition process stable over long time periods, according to the invention, a flow restriction is introduced between the target (5) and the substrate (11) by a diaphragm (20), which amounts to at least 40% of the cross-section of the space. Further, the inert gas is fed between target (5) and aperture (20) at the periphery of the target. Moreover the reaction gas is fed to the mass flow through a distributor device (21) to one side of the diaphragm (20), and finally a glow discharge is also maintained in the region between diaphragm (20) and substrate (11) by means of an anode (25) exposed to the reaction gas arranged on the other side of the aperture.

9 Claims, 2 Drawing Figures

METHOD AND APPARATUS FOR REACTIVE VAPOR DEPOSITION OF COMPOUNDS OF METAL AND SEMI-CONDUCTORS

BACKGROUND TO THE INVENTION

The invention relates to a method for reactive vapour deposition of compounds of metals and semi-conductors on to at least one substrate by a glow discharge inside a space between a vaporising cathode having a target of metal or semi-conductor and the substrate while feeding an inert gas and a reaction gas for the formation of the desired compound, in which the reaction gas is added to the mass flow on its way from the target to the substrate, by means of a distributing device, into a plurality of partial streams, and in which the glow discharge is concentrated by a closed magnetic field in a region in the neighbourhood of the target face.

Reactive vapour deposition is used whenever compounds of metal and semi-conductors, for example, oxides, are to be produced on substrates, which compounds cannot at all or only with difficulty be sputtered in compound form. So, for example, a target composed of silicon dioxide can only be vaporised at high frequencies and even then only at a low rate, while the atomisation of silicon is possible even at high rates by direct current.

Similar facts apply in vapour depositing layers of aluminium oxide. While it is extraordinarily difficult to vaporise target plates of $Al_2O_3$ at anything like a useful rate, a metallic target of aluminium can be vaporised without difficulty at a high rate. This vaporisation process however gradually comes to a halt in reactive atmospheres, that is to say gas atmospheres containing oxygen, because the target face forms aluminium oxide, which does not conduct electricity, so that it prevents the escape of electrons. These considerations also apply with other metals or semi-conductors, whenever they are vaporised in reactive atmospheres using direct current. Such processes can also be characterised as unstable.

The formation of an oxide layer on the target face gives rise to electrical discharges, besides, which discharge the target face from time to time and thus disturb the vapour deposition process.

From DE-PS No. 29 02 142 it is known, in a comparable process, in which however the magnetic field has another configuration in the region of the target face, to add the reaction gas to the mass flow on its way from the target to the substrate in a number of partial streams. This is done by means of an annular distributor, which is provided with a plurality of exit bores for the reactive gas. With such a method, however, the formation of insulating reaction products on the target face is not precluded, even if the distributor arrangement is a part of the work piece mount or the substrate holder in the immediate vicinity of which the chemical reaction is to be carried out. Quite obviously the reaction gas comes into contact with the target face and produces there the layer, for example an oxide layer, of reaction product that gradually brings to a standstill the vaporisation process.

The invention is based on the problem of providing a method of the above described kind in which the vaporisation process, despite the constant supply of reactive gas can remain stable over long periods and in which the vaporisation rate from targets of metal and semi-conductors is achieved.

BRIEF DESCRIPTION OF THE INVENTION

The solution to this problem is arrived at in the above described method, according to the invention, in that (a) in the space between the target and the substrate a restriction of the flow passage, which amounts to at least 40% of the cross-section of the space, is brought about by a diaphragm, (b) the inert gas is fed on one side of the diaphragm at the periphery of the target, (c) the reaction gas is fed to the mass flpw through a distribution arrangement lying on the other side of the diaphragm, and (d) a glow discharge is maintained in the region between diaphragm and substrate by an anode arranged on the other side of the diaphragm and exposed to the reaction gas.

By "cross-section of the space" is meant that space which is bounded by the projection lines of the edge of the target to the substrate plane.

By the restriction of the flow, together with the other measures of the invention is effectively prevented a flowback of the reaction gas, fed on the other side of the diaphragm, to the target face, and this is in addition backed up by feeding the inert gas on the side of the diaphragm, i.e. between target and diaphragm and thus to a certain extent an intensified counterflow is produced through the diaphragm. As a result, the metallic state of the target face is maintained so that the vaporisation process does not diminish over a practically unlimited time and can be kept up with the original high vaporisation rate. Thus, for example, a dynamic vaporisation rate of 3.6 nm/sec can be achieved over many hours with a power density of 12 $W/cm^2$. Without the narrowing of the flow by the construction of the diaphragm and without the anode being arranged according to the invention, the vaporisation rate reverts in a very short time to less than 10% of the original value, namely to about 0.3 nm/sec.

On the other hand it may be noted that a part of the metal condenses on the diaphragm, but even considering the resulting loss of material the amount of oxide deposited on the substrate is always a factor of 9 to 10 higher than the oxide amount without a flow restrictor and without a special anode.

The dimensioning of the diaphragm or the required flow restriction is easily determined by a few simple experiments. If the flow restriction is too great, the long term stability of the vaporisation process is certainly maintained, but the effective vaporisation rate at the substrate, or rather the condensation rate, is markedly reduced.

If the flow restriction is gradually reduced from this condition, the condensation rate first increases with the aperture diameter or width approximately linearly, the increase accelerating more strongly from a certain value. Here there occurs an optimum value, for by a still further enlargement of the aperture diameter or width a reaction (oxidation) begins on the target face, which renders the process unstable. In the region of the above described turning point lies the optimum region for the flow restriction.

It can be seen that under such conditions the diaphragm acts as a kind of extractor pump for the reactive gas and this applies at a distance from the target face. Thus it is possible to carry out the vaporisation process on a metallic target face and at the same time to condense the reaction product on the substrate at a higher rate. By the combined action of all these measures it is thus clear that a separation of gases produces a higher efficiency, which protects the target and serves the substrate.

It is of no very great concern that the diaphragm by its condensation effect occasions a worsening of the rate at which the target material is used up. With relatively inexpensive target materials, which can be reactively deposited at only low rates, the advantages of the inventive method clearly outweigh the disadvantages.

As compared to the classical magnetron arrangement with high frequency supply, a condensation rate can be achieved which is a factor of 2 to 3 greater, without the disadvantage of having to use high frequency supply in diode vaporisation.

It is possible to provide the distribution arrangement for the reaction gas and the anode as a module, thus to make, for example, the anode as a perforated tube connected to a reaction gas source.

It is, however, according to a further invention, particularly advantageous to separate the function of the gas distributor and anode. In this way it is possible to arrange the anode directly adjacent the edge of the aperture and the distributor arrangement for the reaction gas further out, so that the reaction gas can be uniformly distributed in the space between diaphragm and substrate. Here it is particularly useful if the anode is at a potential at least 20 V above the ground potential while the distributor device for the reaction gas is at ground potential.

The invention also relates to an apparatus for carrying out the method above described having a magnetron cathode, a metallic target, a substrate holder, a housing, surrounding the cathode, having an opening in the direction of the substrate holder and held at ground potential, in which there is a first gas inlet with a distributor arrangement.

To solve the same problem such an apparatus according to the further invention is characterised in that (a) in the housing between target and opening is arranged a diaphragm at ground potential and parallel to the target, having an aperture, (b) between diaphragm and opening outside the projection surface of the diaphragm aperture is arranged a second gas inlet with a distribution device, and (c) between the diaphragm and opening is arranged an anode insulated from the housing.

The first gas inlet is connected with a source of inert vaporisation gas, while the second gas inlet is connected with a source of a reactive gas or a gaseous mixture of an inert gas and a reactive gas.

Further advantageous features of the invention will be described below.

BRIEF DESCRIPTION OF THE DRAWINGS

One embodiment of the invention will now be further explained with reference to the accompanying drawin which show FIG. 1 a diagrammatic cross-section through a complete apparatus with appropriate supply devices, and FIG. 2 an underplan view of the diaphragm on a rectangular cathode for coating a travelling band.

DETAILED DESCRIPTION OF THE PREFERRED EMBODIMENTS

Figure 1:
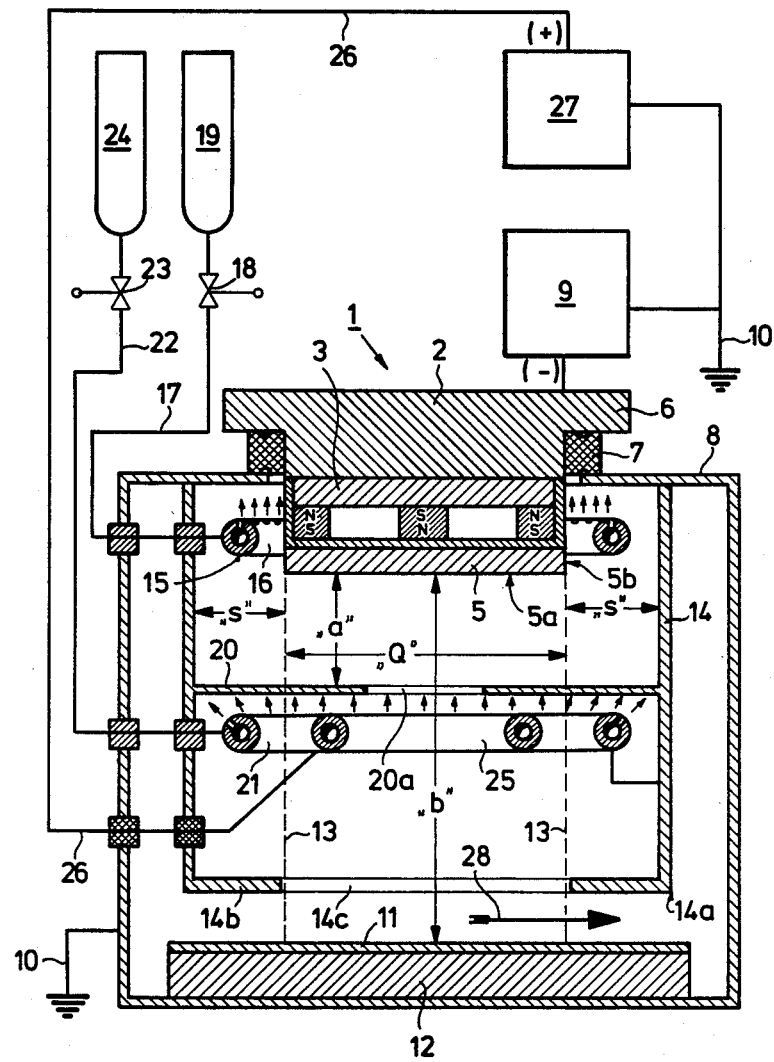

In FIG. 1 is illustrated a magnetron cathode 1, which comprises a cathode base body 2 and a magnet system with permanent magnets N-S or S-N, of which the rearwards pole faces are connected together by a keeper 31. The magnet system is accommodated in a bath- or dish-shaped hollow body 4 the walls of which are joined to the cathode base 2 so as to be gas and liquid tight thereon. On the front face of the hollow body 4 is a plate-like metallic target 5 in good thermal connection, which forms the raw material for the layer to be coated below. The cathode base 2 has a flanged wall 6 which is attached to the cover of a vacuum chamber 8 through an interposed insulator ring 7 and seals (not shown). Such a magnetron cathode produces on the target face 5a a closed tunnel of magnetic field lines, which have the tendency to concentrate, in use, the glow discharge on the target face 5a. To produce this glow discharge the magnetron cathode 1 is connected to a d.c. source 9, whose other pole is likewise connected to ground 10 as is the vacuum chamber 8.

At a position opposite the target face 5a a distance "b" therefrom, is a substrate 11, beneath which is arranged a substrate holder 12. In the case where the substrate is a plastic film to be coated, beneath the substrate is a cooling roller or drum, not shown. In any event, the substrate holder is held at ground potential.

Details of such a magnetron cathode, its mounting in a vacuum chamber as well as the supporting or guiding of the substrate form part of the state of the art, so that they need not be gone into further here.

Between the target 5 and the substrate plane can be described a notional space bounded by the broken projection lines 13 from the target edge 5b, which are of importance in regard to the geometric relationships hereinafter to be explained.

The magnetron cathode 1 is, within the vacuum chamber 8, surrounded by a housing 14 of which the side walls run parallel to the projection lines 13. The housing 14 has an all round spacing "s" from the magnetron cathode, and, between the magnetron cathode and the housing, an annular closed space 15 is formed. In this space is located, behind a plane in which the target face 51 lies, a first gas inlet 16 with a distributor arrangement, which has a number of upwardly directed perforations. The flow therefrom is indicated by small arrows. The gas inlet 16 is connected by a lead 17 and a regulator valve 18 to a source 19 for an inert vaporising gas (preferably argon).

The housing 14 is also, like the vacuum chamber 8, at ground potential and extends up to the neighbourhood of the substrate 11. It is provided, in the region of its lower peripheral edge 14a with an end wall 14b in which there is an opening 14c. The cross-section of this opening corresponds substantially to the so-called space cross-section "Q" between the projection lines 13. It is, however, always possible to increase the cross-section of the opening 14c and for example even to dispose of the end wall 14b.

Within the housing 14, between the target 5 and the opening 14c, is located a diaphragm 20 parallel to the target and having an aperture 20a. The cross-sectional area of this aperture 20a stands in a predetermined relationship to the cross-section Q of the space, and the aperture should not be greater than 60% of the space cross-section Q, so that a flow restriction is effected which amounts to at least 40% of the space cross-section. The geometrical relationships outside the projection lines 13 are relatively unimportant; it is simply necessary that the diaphragm 20 is gas-tight over the whole of its periphery and in electrical connection with the housing 14.

The distance "a" of the diaphragm 20 from the target face 5a should be about one-third of the distance "b" between target face 5a and substrate 11.

Between the diaphragm 20 and the opening 14c there is arranged, outside the projected area of the aperture 20a, a second gas inlet 21 with a distributor arrangement, which in this case is also formed with numerous perforations. The perforations are in this embodiment directed at about 45° outwardly and upwardly, so that they direct partial flows as indicated by the arrows.

Obviously the distributor arrangements for both gas inlets 16 and 21 could also be formed from so-called circular slit nozzles, i.e. in the limiting case the number of partial flows is infinite and it forms a continuous veil or curtain of gas.

The second gas inlet 21 is connected by a lead 22 and a regulating valve 23 with a source 24 of a reactive gas or a mixture of a reactive and an inert gas.

Between the diaphragm 20 and the opening 14c is an anode 25 insulated from the housing 14. This anode is formed as a closed ring and lies outside the projected surface of the aperture 20a, running, however, directly adjacent the edge of the aperture 20a and following its course. As illustrated, the anode 25 is also arranged inside the gas inlet 21. The anode 25 is connected by a lead 26 with a source of d.c. voltage 27, the opposite pole of which is grounded. The d.c. voltage source 27 has an output potential regulatable between +20 Volts and +100 Volts. By the arrangement of the second gas inlet 21 in the space between the diaphragm 20 and the opening 14c the anode 25 is naturally exposed to the reaction gas. Through the particular polarity of the anode 25, the glow discharge burning particularly in the space between the target 5 and the diaphragm 20 is drawn through the aperture 20a to the anode 25, which can be clearly seen from the emitted light. The higher the positive anode potential is raised above ground potential, the more pronounced is this effect. It may be noted that in this way at least 80% of the discharge current flows over the anode. This effects a strong activation of the reaction gas, so that an intensive chemical reaction is produced between the reaction gas and the metal particles vaporised from the target 5, so that a completely oxidised layer can be deposited on the substrate 11, presupposing a sufficiency of oxygen.

In FIG. 1 is shown a rotationally symmetrical system, that is to say the housing 14 and also the components arranged or extending into it are formed as bodies of rotation except only for the gas heads 17 and 22 and the electric lead 26.

The principle of construction can however immediately be transferred to rectangular cathodes, as will be explained with reference to FIG. 2.

Figure 2:
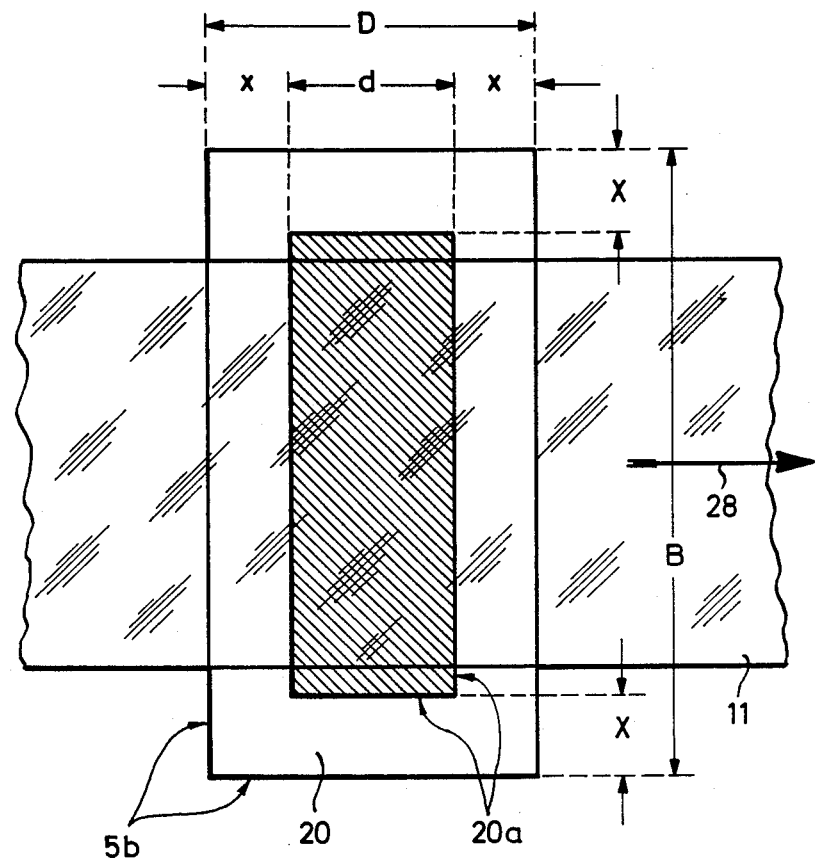

FIG. 2 shows a target edge. So far as the target 5 is contained within the region of a plan area which the target face 5i a goes beyond by a small amount, the target edge 5b is the edge of the free, i.e. visible, target face. The target edge 5b defines the position of the projection lines 13 which run in FIG. 2 vertically to the drawing plane. Within the target edge 5b is seen the part of the diaphragm 20 with the aperture 20aextending into the space cross-section "Q". The cross-sectional area of the aperture is hatched. The aperture has clearly the form of a rectangle with one long axis. The substrate 11 (a film or glass web) moves in the direction of arrow 28 at right angles to this long axis, as shown also in FIG. 1, as the cross-section of the arrangement according to FIG. 1 also applies to a rectangular anode according to FIG. 2. Also it means that through the diaphragm 20 is produced a flow restrction which amounts to at least 40% of the cross-section of the space. With a rectangular cathode, however, the geometric relationships accord to the transport direction of the substrate.

In FIG. 2 the transverse dimension of the aperture 20a is indicated as "d". The cross-section of the space, of which the transverse dimension in the same direction is indicated by "D", is thus on both sides greater by an amount "x". Perpendicular hereto the cross-section of the space is determined by the breadth dimension "B". Now one determines the edges of the aperture parallel to the transport direction so that one goes inwards by the amount "x" equally on either side from the corresponding target edges 5b. As indicated, the desired flow restriction is effected without an excessively large part of the length of the rectangular cathode (transverse to the transport direction) being wasted. The limits of the useful dimensions for the individual measurements are given in claim 7.

EXAMPLE

In a cathode vaporising apparatus of Type A 550 VZK (Manufacturer: Leybold-Heraeus GmbH of Hanau, West Germany) having a cathode arrangement according to FIG. 1 of type PK 75, metallic targets of aluminium and tantalum as well as a sintered target of conductive silicon are vaporised, and argon fed in through the first gas inlet 16 and oxygen through the second gas inlet 21. The vaporisation data are set out in the table below. The diameter of the effective target face 5a was 75 mm, the diameter of the aperture 20a in all cases 37 mm. These diameters were determined by the above described optimising trials. The distance "a" was 20 mm, the distance "b", 60 mm. As substrate 11 glass plates of sides 5 cm×5 cm (so-called "slide glasses") were used, which were coated both statically and dynamically (by giving them a relative motion).

It may be noted that at the target, even over long periods, about the same high vaporisation rate was attained as in a pure argon atmosphere, while on the substrates, absorption-free oxide was deposited at correspondingly high rates. The relevant rates of deposition are likewise given in the table below.

TABLE

| Oxide | $Al_2O_3$ | $Ta_2O_5$ | $SiO_2$ |
|---|---|---|---|
| Target Material | Al | Ta | Si |
| Cathode Potential (V) | −412 | −580 | −460 |
| Cathode Current (A) | 1.3 | 1 | 0.9 |
| Power Density (Watt/$cm^2$) | 12 | 13.2 | 9.4 |
| Anode Potential (V) | +40 | +40 | +40 |
| Anode Current (A) | 1.3 | 1 | 0.9 |
| Oxygen Flow (sccm/min) | 3.2 | 7.8 | 2.7 |
| Argon pressure (m bar) | $2 \times 10^{-2}$ | $2 \times 10^{-2}$ | $2 \times 10^{-2}$ |
| Sputtering pressure (m bar) | $2 \times 10^{-2}$ | $2 \times 10^{-2}$ | $2 \times 10^{-2}$ |
| Deposition rate (nm/s) | 3.6 | 5.4 | 2.4 |

The above table first shows that in all cases the anode current is the same as the cathode current, i.e. at the selected anode potential of +40 Volt above ground potential, the entire discharge current flows through the anode.

Comparative tests, carried out without positive potential on the anode lead to an approximately 15 to 20% higher oxygen consumption in order to achieve a similar through-oxidation of the deposits. This clearly indicates a very substantial activation of the oxygen by the positive anode potential.

Especially in the example with $AL_2O_3$ it is clear that the method according to the invention allows high deposition rates, as the target can be vaporised at the rate of a metallic target, while the complete oxide forms on the substrate. According to the existing conventional reactive oxidation processes, for $AL_2O_3$ at the same power density can be achieved only a deposition rate of about 0.3 to 0.4 nm/sec. By "anode" in the above is to be understood an electrode which lies at a definite positive potential with respect to a comparison ground potential and consequently the comparison ground is insulated and principally serves as an electron absorber and simultaneously to give a definite acceleration to the electron. The additional acceleration potential is the potential difference between ground and anode.

The vacuum chamber, which lies at ground potential together with its attachments then takes up the cathode current not taken up by the special anode, the ground, looked at relatively, also appearing to be an anode.

We claim:

1. Method for reactive vapor deposition of compounds of metals and semi-conductors, on at least one substrate by a glow discharge inside a space between a vaporising cathode with a target of metal or semi-conductor and the substrate, feeding separately an inert gas and a reaction gas for the formation of a desired compound, in which the reaction gas is fed to the mass flow in its path from the target to the substrate by means of a distributor arrangement in a plurality of partial streams and in which the glow discharge is concentrated by a closed magnetic field in a region in the neighborhood of the target face, characterised in that
   (a) in the space between the target and the substrate there is a flow restriction by means of a diaphragm which amounts to at least 40% of the cross-section of the space,
   (b) the inert gas is fed from one side of the diaphragm to the periphery of the target,
   (c) the reaction gas is fed through a distributor device situated on the other side of the diaphragm, and
   (d) a glow discharge is maintained in the region between the diaphragm and the substrate by an anode exposed to the reaction gas, arranged on the other side of the diaphragm.

2. Method according to claim 1, characterised in that the distributor arrangement is held at ground potential and the anode is at a potential which is at least +20 volts above the ground potential.

3. Apparatus for carrying out the method according to claim 1, having a magnetron cathode, a metallic target, a substrate holder, a housing at ground potential surrounding the cathode and provided with an opening directed towards the substrate holder, in which there is a first gas inlet with a distributor arrangement, characterised in that
   (a) in the housing between target and opening is arranged said diaphragm with an aperture which is at ground potential and parallel to the target,
   (b) between diaphragm and opening outside the projected area of the aperture is arranged a second gas inlet with a distributor arrangement, and
   (c) between diaphragm and opening is arranged an anode insulated from the housing.

4. Apparatus according to claim 2, characterised in that the anode is formed as a closed ring and is arranged outside the projected area of the aperture.

5. Apparatus according to claim 4, characterised in that the anode is arranged in the immediate neighbourhood of the edge of the aperture, following the edge.

6. Apparatus according to claim 3, characterised in that the target is arranged to project into the housing in such manner that between the cathode and the housing is provided an annular closed space and that the first gas inlet is located in this space and behind a plane in which the target face lies.

7. Apparatus according to claim 3, characterised in that with a rectangular cathode the transverse dimension of the diaphragm aperture—as seen by a moving substrate in the direction of motion—corresponds to 0.2 to 0.8 times the spacing of the projection lines in the same direction.

8. Apparatus according to claim 3, characterised in that with circular cathodes the diameter of the diaphragm aperture (20a) corresponds to 0.2 to 0.8 times the spacing of the projection lines.

9. Apparatus according to claim 3, characterised in that the distance "a" of the diaphragm from the target (5) corresponds to about one third of the distance "b" of the substrate from the target.

* * * * *